(12) United States Patent
Chi et al.

(10) Patent No.: US 6,498,081 B2
(45) Date of Patent: Dec. 24, 2002

(54) METHOD OF MANUFACTURING SELF-ALIGNED CONTACT HOLE

(75) Inventors: Kyeong-koo Chi, Seoul (KR); Byeong-yun Nam, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/760,818

(22) Filed: Jan. 17, 2001

(65) Prior Publication Data

US 2001/0021576 A1 Sep. 13, 2001

(30) Foreign Application Priority Data

Mar. 13, 2000 (KR) .............................................. 00-12427

(51) Int. Cl.⁷ .......................................... H01L 21/3205
(52) U.S. Cl. ....................................... 438/586; 438/300
(58) Field of Search ................................. 438/586, 300, 438/612, 241, 634; 257/382; 437/195, 21, 52, 31; H01L 21/28

(56) References Cited

U.S. PATENT DOCUMENTS

| | | | | |
|---|---|---|---|---|
| 4,837,176 A | * | 6/1989 | Zdebel et al. | 437/31 |
| 5,308,782 A | * | 5/1994 | Mazure et al. | 437/52 |
| 5,382,545 A | * | 1/1995 | Hong | 437/195 |
| 5,482,871 A | * | 1/1996 | Pollack | 437/21 |
| 5,933,755 A | * | 8/1999 | Lee | 438/634 |
| 6,072,221 A | * | 6/2000 | Hieda | 257/382 |
| 6,204,161 B1 | * | 3/2001 | Chung et al. | 438/612 |
| 6,211,025 B1 | * | 4/2001 | Gardner et al. | 438/300 |
| 6,214,662 B1 | * | 4/2001 | Sung et al. | 438/241 |

* cited by examiner

Primary Examiner—David Nelms
Assistant Examiner—Thinh Nguyen
(74) Attorney, Agent, or Firm—Volentine Francos, PLLC

(57) ABSTRACT

A method of manufacturing a self-aligned contact hole. Gate patterns are formed on a semiconductor substrate with an interposing gate insulating layer, and a first insulating pattern for filling a gap between the gate patterns is provided. A portion of the first insulating pattern is etched by self-aligned contact etching to form a first contact hole. A spacer is formed on a side wall of the first contact hole, and a first plug layer of conductive silicon fills the first contact hole. Partial etchback is performed to etch the first plug and gate pattern to a predetermined thickness, such that the top portion of the spacer projects higher than the surface of the first plug and gate pattern. A second plug layer of conductive silicon fills a gap between the projected spacers, and a thickness of the second plug layer at a portion filling the gap between the spacers is greater than that at a portion deposited on the gate pattern. The second plug layer is then etched back to a uniform thickness to expose the sides of the spacer and the first insulating pattern adjacent to the gate pattern, thereby forming a second plug connected to the first plug. A capping protective layer covers and protects the gate pattern while exposing the top surface of the second plug. A second insulating pattern is formed on the capping protective pattern, which has a second contact hole exposing at least the top surface of the second plug.

19 Claims, 4 Drawing Sheets

METHOD OF MANUFACTURING SELF-ALIGNED CONTACT HOLE

BACKGROUND OF THE INVENTION

1. Field of the Invention

The present invention relates to a method of manufacturing semiconductor devices, and more particularly, to a method of manufacturing a self-aligned contact (SAC) hole, which method facilitates providing a sufficient overlay margin in a photolithography process.

2. Description of the Related Art

As the miniaturization of semiconductor devices progresses, the processes to achieve the required implementation are becoming increasingly difficult and challenging. For example, in a photolithographic process used for forming miniature patterns, as an overlay margin becomes smaller, a small contact process becomes more difficult to perform.

As an alternative to securing an overlay margin, SAC etching processes have been employed. The SAC etching process takes advantage of an etching selectivity between two different kinds of insulating layers to form a contact hole. SAC etching has an advantage in that a sufficient overlay margin can be provided during photolithography. However, as integration of semiconductor devices increases, the required aspect ratio of a contact hole increases significantly. This requires an increase in dry etching selectivity achieved between two different kinds of insulating layers used in a SAC etching process.

In general, a SAC etching process utilizes a combination of a silicon oxide ($SiO_2$) layer and a silicon nitride ($Si_3N_4$) layer as the insulating layers. Specifically, when dry etching a $SiO_2$ layer, a $Si_3N_4$ layer can be used as a spacer and etch mask. A commonly obtainable etching selectivity of $SiO_2$ to $Si_3N_4$ is only about 5:1, while the $SiO_2$ to $Si_3N_4$ dry etching selectivity that is required in an actual process of a stable semiconductor device is about 20:1.

To solve this problem, recent studies focus on obtaining a higher etching selectivity ratio of $SiO_2$ to $Si_3N_4$ in a dry etching process itself. For example, representative approaches include a method of increasing the concentration of a $CF_x$ radical within plasma used as an etchant by heating the wall of a chamber in which dry etching is performed, and development of a dry etching process that uses $C_4F_8$, $C_5F_8$ or $C_3F_6$ as a new fluorocarbon series gas having a high C/F ratio. Furthermore, an attempt to suppress excessive occurrences of F radicals due to extreme dissociation within plasma with the development of a new plasma source having low electron temperature has been known. However, at the present time, it is known that new dry etching processes still achieve $SiO_2$ to $Si_3N_4$ dry etching selectivity of only 10:1

SUMMARY OF THE INVENTION

To solve the above problems, it is an objective of the present invention to provide a method of manufacturing a self-aligned contact hole, wherein the process stability required for semiconductor device manufacturing can be provided by lowering the dependence of a self-aligned contact (SAC) etching process on etching selectivity between different kinds of insulating layers used in the SAC etching process.

Accordingly, to achieve the above objective, the present invention provides a method of manufacturing a self-aligned contact hole in a semiconductor device. According to the method, first, a plurality of gate patterns are provided on a semiconductor substrate interposing a gate insulating layer. The gate patterns may be composed of a conductive polycrystalline silicon. Then, a first insulating pattern for filling the gap between the gate patterns and exposing the top surface of the gate patterns is formed. The first insulating pattern may be comprised of silicon oxide. Next, the first insulating pattern is selectively etched by self-aligned contact etching to form a first contact hole for exposing the semiconductor substrate. Next, a spacer is formed along a sidewall of the first contact hole. The spacer may be comprised of silicon nitride. Then, a first plug comprised of a conductive silicon layer, which exposes the top surface of the spacer and fills the first contact hole, is formed. The first plug and the gate pattern are partially etched back to a predetermined thickness from the top surface of the first plug and the gate pattern, using the top surface of the first plug and the gate pattern as an etch mask, so that the top portion of the spacer is projected higher than the surface of the first plug and the gate pattern. Then, a second plug layer comprised of a conductive silicon layer, which exposes at least the gap between the projected spacers, is formed on the first plug and the gate pattern, wherein the thickness of the second plug layer in that portion filling the spacers is greater than that deposited on the gate pattern. Next, the second plug layer is etched back to a uniform thickness along the entire surface to expose the sides of the spacer and the first insulating pattern adjacent to the gate pattern, and then the portion of second plug layer filling the gap between the spacers is separated to form a second plug connected to the first plug. In this case, the etchback is performed by wet etching.

After forming the second plug, a metal silicide layer may be further selectively formed on the top surface of the gate pattern. In this case, the metal silicide layer may be selectively formed on the surface of the second plug as well.

A capping protective pattern, which exposes the top surface of the second plug, fills at least the gap between the first insulating pattern and the spacer, and is connected to the spacer to cover and protect he gate pattern, is formed. A second insulating pattern having a second contact hole which exposes at least the top surface of the second plug is formed on the capping protective pattern.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
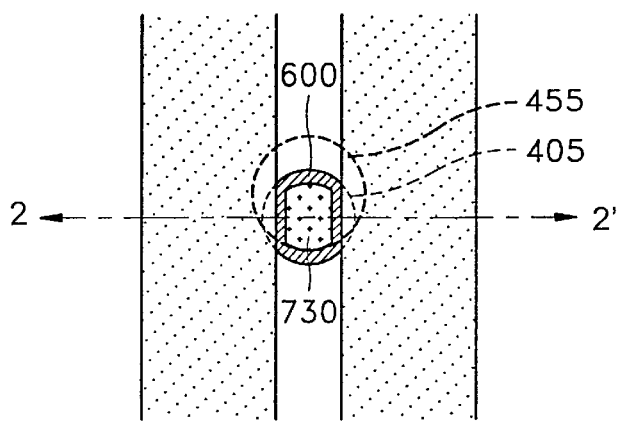
FIG. 1 is a plan view for explaining a method of manufacturing a self-aligned contact hole according to a first embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shape of elements is exaggerated for clarity, and the same reference numerals in different drawings represent the same element. Further, it will be understood that when a layer is referred to as being "on" another layer or substrate, it can be directly on the other layer or substrate, or intervening layers may also be present.

An embodiment of the invention proposes a new self-aligned contact process which does not greatly depend on a dry etching selectivity ratio obtained between two different kinds of insulating layers, for example, a dry etching selectivity ratio of $SiO_2$ to $Si_3N_4$. Thus, it is possible to overcome a restriction of self-aligned contact (SAC) etching due to a dry etching selectivity ratio obtained by dry etching, which selectivity ratio is lower than the required level in an actual SAC etching process. The new SAC etching process forms a contact hole using a combination of $Si/SiO_2$ which is known to have high selectivity in a general dry etching process. The present invention will now be described in detail in conjunction with FIGS. 1–12.

Figure 2:
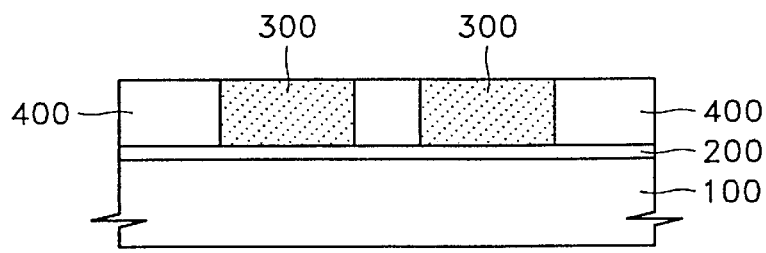
FIGS. 2–11 are cross-sectional views taken along line 2–2' of FIG. 1 for explaining each process in a method of manufacturing a self-aligned contact hole.

FIG. 2 shows a step of forming a gate pattern 300 and a first insulating pattern 400 on a semiconductor substrate 100. More specifically, a gate insulating layer 200 is formed on an active area of a substrate 100. Then, after forming a conductive layer on top of the gate insulating layer 200 overlying the substrate 100, a photolithography process is performed to form a gate pattern 300. The gate pattern 300 may be comprised of various conductive materials, preferably, a conductive polycrystalline silicon (polysilicon) doped with impurities.

The gate pattern 300 may be formed to an initial thickness which is greater than the thickness required in a semiconductor device design. This is because a predetermined thickness from the surface of the gate pattern 300 is etched away to reduce the overall thickness thereof for a subsequent process. Thus, the thickness of the gate pattern 300 must be fixed considering the thickness to be removed in a subsequent process for reducing the thickness of the gate pattern 300.

A plurality of line type gate patterns 300 may be formed. A portion of a semiconductor substrate 100 between the line type gate patterns 300 is exposed by contact holes 405 and 455 which are formed as shown in FIG. 1. The contact holes 405 and 455 are provided for forming a wiring line such as a bit line in a transistor structure including the gate patterns 300.

Meanwhile, the gap between the gate patterns 300 is significantly reduced because of the reduction in design rules of a semiconductor device. Thus, as has been described above, application of a usual SAC etching process becomes increasingly more difficult. As a solution thereto, embodiments of the invention present a new SAC technique which is intended to overcome the reduction of design rules.

First, a first insulating pattern 400 for filling a gap between the gate patterns 300 is formed for insulting the plurality of gate patterns 300 from each other. For example, a first insulating layer, which completely fills at least the gap between the gate patterns 300, is formed as a silicon oxide layer. The first insulating layer is preferably composed of a material having good step coverage so that the gap between the gate patterns 300, which is significantly reduced according to the reduced design rules, can be sufficiently filled. For example, the first insulating layer may be composed of a silicon oxide insulating material having an excellent fluidity such as spin on glass (SOG), flowable oxide (FOX), or borophosphosilicate glass (BPSG). Alternatively, a multiple layer, in which a chemical vapor deposition (CVD) oxide layer or a plasma enhanced (PE) oxide layer is deposited after thinly depositing an insulating layer made of a material having excellent fluidity to attenuate step difference, can be used as the first insulating layer.

Figure 3:
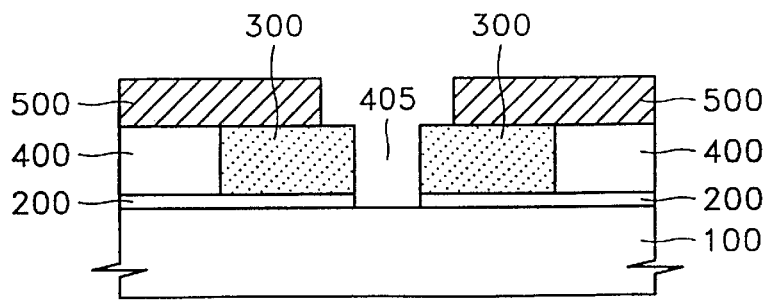

Next, the surface of the first insulating layer is planarized to expose the surface of the gate pattern 300. The planarization may be performed by various planarization techniques, preferably by chemical mechanical polishing (CMP). If the CMP is performed so that the surface of the gate pattern 300 may be exposed, then a first insulating pattern 400 for filling a gap between the gate patterns 300 is formed. FIG. 3 shows a step of forming a first contact hole 405, which exposes the substrate 100 between the gate patterns 300, through the first insulating pattern 400. More specifically, a photoresist pattern 500 is used as an etch mask for selectively etching a portion of the first insulating pattern 400. In this case, the photoresist pattern 500 is formed to expose a portion of the gate pattern 300. Note that the size of the portion exposed by the photoresist pattern 500 may be larger than the gap between the gate patterns 300, in which case more photo process margin can be secured in forming the photoresist pattern 500.

Using the photoresist pattern 500 as an etch mask, a portion of the first insulating pattern 400 is selectively etched to form a first contact hole 405 exposing the underlying semiconductor substrate 100. In this case, since the photoresist pattern 500 exposes a portion of the gate pattern 300 as has been described, the gate pattern 300 is also used as an etch mask for selectively etching the first insulating pattern 400. In other words, the first contact hole 405 is formed by a SAC etching process which uses the photoresist pattern 500 and the gate pattern 300 as an etch mask.

The gate pattern 300 may be composed of polysilicon, and the first insulating pattern 400 subjected to etching may be comprised of silicon oxide. It is known that polysilicon to silicon oxide etching selectivity is about 1:10 in a general dry etching process, for example, using plasma excited from a source including a fluorocarbon series gas such as tetrafluorocarbon ($CF_4$) as an etchant. Thus, the gate pattern 300 exposed by the photoresist pattern 500 can sufficiently function as an etch mask in selectively etching the first insulating pattern 400. This is because the depth of the first contact hole 405 is only about the thickness of the gate pattern 300, so that a very high etching selectivity is not required. The first contact hole 405 have sidewalls composed of the exposed sidewalls of the first insulating pattern 400 and the exposed sidewalls of the gate pattern 300.

Figure 4:
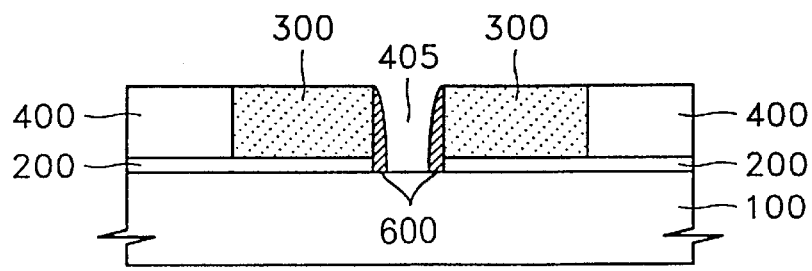

FIG. 4 shows a step of forming a spacer 600 along the sidewall of the first contact hole 405. More specifically, after an insulating layer (not shown) is thinly deposited on the resulting material in which the first contact hole 405 has been formed, anisotropic etching is performed to form a spacer 600 which selectively covers only the sidewall of the first contact hole 405. The spacer 600 serves to cover and shield the sidewall of the gate pattern 300. The spacer 600 may be composed of an insulating material having an excellent etching selectivity with respect to polysilicon forming the gate pattern 300. For example, the spacer 600 may be formed of silicon nitride, which is known to have an excellent etching selectivity with respect to silicon.

Figure 5:
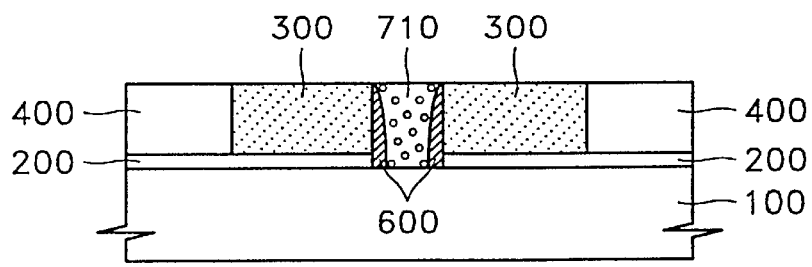

FIG. 5 shows a step of forming a first plug 710 for filling the first contact hole 405. First, a conductive layer for completely filling at least the first contact hole 405 is provided on the resulting material in which the spacer 600 has been formed, and then the conductive layer is planarized by CMP. In this case, planarization is performed to the point where the top surface of the underlying first insulating pattern 400 and spacer 600 is exposed. As a result, a conductive first plug 710 for selectively filling only the first contact hole 405 is formed. The first plug 710 may be formed of a conductive material having a similar dry etching selectivity with respect to the gate pattern 300. For example, if the gate pattern 300 is made of conductive polysilicon, the first plug 710 may be also formed of the same material.

Figure 6:
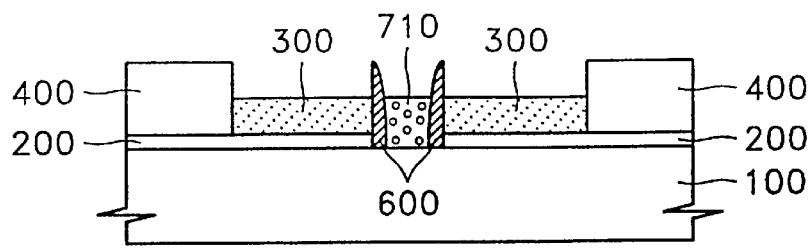

FIG. 6 shows a step of etching the gate pattern 300 and the first plug 710 to a predetermined thickness from the top surface thereof, using the first insulating pattern 400 and the spacer 600 as an etch mask. In this process the top surface of the gate pattern 300 and the first plug 710 is selectively etched back. In this case, since the gate pattern 300 and the first plug 710 may be comprised of polysilicon, a general polysilicon etchback process can be applied.

For example, an anisotropic dry etching process using plasma excited from a source including a fluorocarbon series gas such as tetrafluorocarbon ($CF_4$) as an etchant may be used as the selective etchback process. Since the first insulating pattern 400 and the spacer 600 acting as an etch mask are composed of silicon nitride, the dry etching process selectively etches back the gate pattern 300 and the first plug 710, since both are composed of polysilicon as described above.

As a result of the etchback process, the gate pattern 300 and the first plug 710 are etched to a predetermined thickness from the top surface thereof. That is, a partial etchback process, to which a time etch is applied, is used. In this case, if the gate pattern 300 and the first plug 710 are formed of conductive polysilicon, the etch amount of the gate pattern 300 becomes substantially equal to the etch amount of the first plug 710. As a result, the top surface of the gate pattern 300 and the first plug 710 is made lower than the top surface of the first insulating pattern 400 and the spacer 600. In other words, the surface of the gate pattern 300 is recessed by a predetermined depth compared to the top surface of first the insulating layer pattern 400 and the spacer 600. The same is true of the first plug 710. Thus, the spacer 600 is projected upwardly from a horizontal plane comprising the surface of the gate pattern 300 and the first plug 710.

Figure 7:
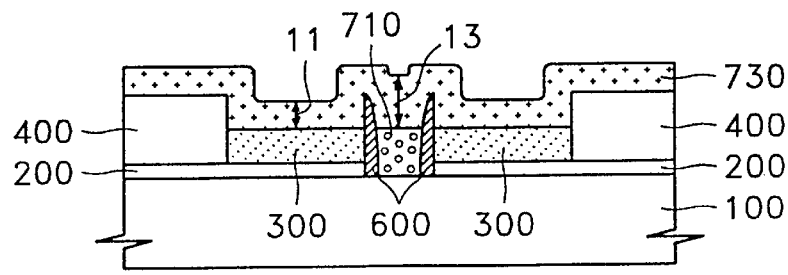

FIG. 7 shows a step of forming a conductive second plug layer 730 for filling at least the gap between the spacers 600 and above the first plug 710. The conductive second plug layer 730 is formed on the resulting material in which the gate pattern 300 and the first plug 710 are selectively subjected to a partial etchback process. The second plug layer 730 may be provided to a sufficient thickness to fill at least the gap between the spacers 600 on the first plug 710, which was formed as a result of the partial etchback process. The second plug layer 730 may be formed by a general deposition technique, for example, depositing a conductive material by sputtering or CVD. The conductive material for the second plug layer 730 can be conductive polysilicon as with the first plug 710.

The deposition thickness of the second plug layer 730 differs depending on the shape and structure of the resulting material formed by the partial etchback. Specifically, the thickness 13 of the second plug layer 730 deposited on the first plug 710 having a relatively small area is greater than the thickness 11 of the second plug layer 730 deposited on the gate pattern 300 having a relatively large area. This difference in thickness is an expected and generally known inherent characteristic of conventional deposition materials.

Figure 8:
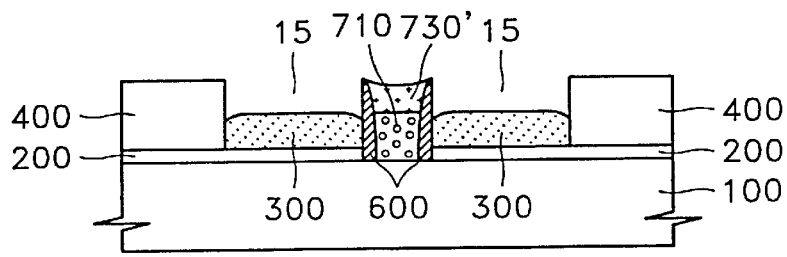

FIG. 8 shows a step of removing the second plug layer 730 to a predetermined thickness from the surface thereof. An etchback process may be performed so that the second plug layer 730 is removed from the entire surface to a uniform thickness. For example, if the second plug layer 730 is formed of polysilicon, the second plug layer 730 is etched back from the surface by a general wet etch process. Wet etching is isotropic, which is a known characteristic whereby a material layer is entirely etched to a uniform thickness regardless of the shape and structure of the material layer. If wet etching is used, the same etching amount can be obtained in one portion of the second plug layer 730 deposited on the first plug 710 and the other portion deposited on the gate pattern 300. An etchback step using the wet etching process may be performed so as to expose at least the top portion of the spacer 600. Furthermore, the etchback may be performed so as to expose the top surface of the first insulating pattern 400 underlying the second plug layer 730.

Meanwhile, since the first insulating pattern 400 has a substantially large area, the thickness of the second plug layer 730 deposited on the first insulating pattern 400 is at least equal to the thickness 11 of the second plug layer 730 deposited on the gate pattern 300. Thus, if a wet etch is performed on the second plug layer 730 so that the top surface of the first insulating pattern 400 may be exposed, as described above, a portion of the second plug layer 730 deposited on the gate pattern 300 can be removed.

In addition, a portion of the underlying gate pattern 300 is also exposed and etched by the wet etching process. In this case, etching is focused on the edges of the gate pattern 300 affected by the shape and structure, so that the edges can be etched more than other portions. However, since the second plug layer 730 is formed of conductive polysilicon as has been described above, the second plug layer 730 may remain on the gate pattern 300 by the wet etching process.

When the second plug layer 730 is partially etched back in this way by a wet etch, the portion of the second plug layer 730 deposited on the first plug 710, which has a relatively small area, selectively remains. This is because the thickness 13 of the second plug layer 730 deposited on the first plug 710 is greater than that deposited on other portions, for example, the thickness 11 of the second plug layer 730 deposited on the gate pattern 300. The remaining portion of the second plug layer 730, i.e., a second plug 730', serves as a conductive plug for substantially filling the gap between the spacers 600 and the first contact hole 405 together with the underlying first plug 710.

Thus, the surface of the second plug 730' on the first plug 710 is substantially higher than the surface of the gate pattern 300 subjected to etchback. Thus, a recessed portion 15 is formed between the spacer 600 and the first insulating pattern 400. Note also that the sidewalls of the spacer 600 and the first insulating pattern 400 which are adjacent to the gate pattern 300 are also exposed to the recessed portion 15.

Figure 9:
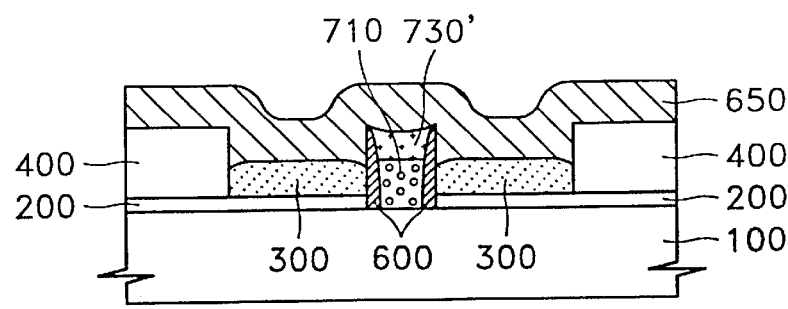

FIG. 9 shows a step of forming a capping protective layer 650 for filling at least the recessed portion 15 between the spacer 600 and the first insulating pattern 400. Referring to FIG. 9, a capping protective layer 650 composed of an insulating material is provided on the resulting material, which has been etched back by a wet etch as has been described above. The capping protective layer 650 may be formed to a thickness which is sufficient to completely fill at least the recessed portion 15 formed as a result of the wet etch. Furthermore, the capping protective layer 650 may be comprised of silicon nitride, taking into consideration an interface characteristic with the spacer 600, which is also comprised of the silicon nitride.

Figure 10:
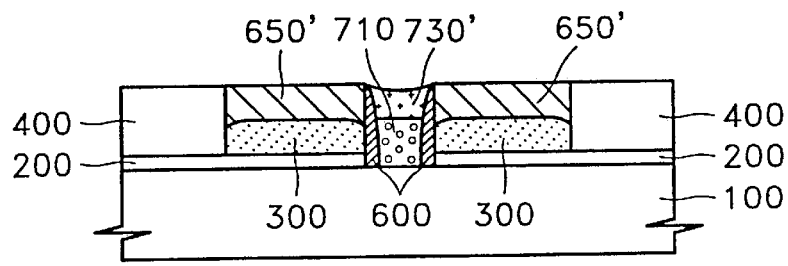

FIG. 10 shows a step of planarizing the capping protective layer 650 to expose the top portion of the spacer 600 and the top surface of the second plug 730'. Referring to FIG. 10, the capping protective layer 650 is planarized by a planarization technique such as CMP so that at least the top surface of the underlying first insulating pattern 400 may be exposed. Furthermore, the planarization is performed so as to expose the top surface of the second plug 730'. As a result, only a portion of the capping protective layer 650 which fills the recessed groove 15 remains. In other words, a capping protective pattern 650' for covering and shielding the top portion of the gate pattern 300 is formed by the planarization. The capping protective pattern 650' connects with the spacer 600 thereby preventing the surface of the gate pattern 300 from being exposed.

Figure 11:
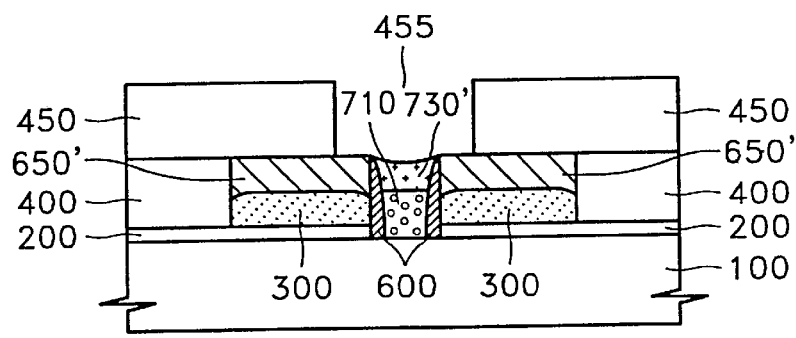

FIG. 11 shows a step of forming a second insulating pattern 450 having a second contact hole 455 which exposes the top surface of the second plug 730'. Referring to FIG. 11, an insulating material is deposited on the resulting material, in which the capping protective pattern 650' has been formed, to form a second insulating layer. The insulating layer may be comprised of various insulating materials, preferably silicon oxide. Thereafter, the second insulating layer is patterned by photolithography to form a second insulating pattern 450 having a second contact hole 455 which exposes the surface of the underlying second plug 730'. In this case, a general dry etching process, which, for example, may use plasma excited from a source including a fluorocarbon series gas such as tetrafluorocarbon ($CF_4$) as an etchant, may be used.

As shown in FIG. 1, the second contact hole 455 is aligned to the first contact hole 405. In this case, an etching process for forming the second contact hole 455 can be finished by the capping protective pattern 650' underlying the second insulating layer and the spacer 600. This is because the silicon oxide of the second insulating layer has an excellent etching selectivity to silicon nitride forming the spacer 600 and the capping protective pattern 650' in the dry etching process. Thus, the etching process for forming the second contact hole 455 can use the spacer 600 and the capping protective pattern 650' as a means of completing the etching.

Accordingly, an alignment margin of the second contact hole 455 with respect to the first contact hole 405 can be further secured. For example, if alignment of the second contact hole 455 with the first contact hole 405 is deviated to some extent, or the diameter of the second contact hole 455 is larger than that of the first contact hole 405, as shown in FIG. 1, the gate pattern 300 can be protected from the etching process by the capping protective pattern 650' and the spacer 600. Furthermore, the gate pattern 300 can be sufficiently insulated from a wire for filling the second contact hole 455 in a subsequent process. Securing a sufficient alignment margin of the second contact hole 455 can overcome a restriction of resolution in a photo process.

For a subsequent process, a conductive wire for filling the thus formed second contact hole 455 (e.g., a bit line), is formed. In this case, since the diameter of the second contact hole 455 is designed larger than that of the first contact hole 405, it is advantageous to enhance a contact hole filling characteristic of the conductive wire.

Figure 12:
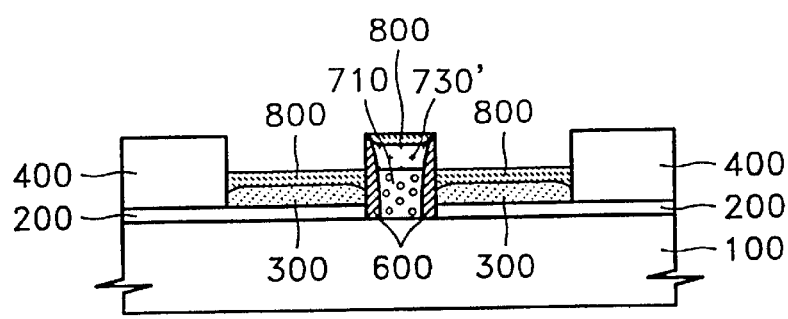
FIG. 12 a cross-sectional view for explaining a method of manufacturing a self-aligned contact hole of a semiconductor device according to a second embodiment of the invention.

FIG. 12 is a cross-sectional view for explaining a method of manufacturing a self-aligned contact hole of a semiconductor device according to a second embodiment of the invention. The same reference numerals in the first and second embodiments represent the same elements. Compared to the first embodiment of the invention, between the steps identified in FIGS. 8 and 9, the second embodiment of the invention further includes the step of selectively introducing a metal silicide layer 800 onto the gate pattern 300 comprised of polysilicon. In order to improve the operational speed of a transistor, in the case in which a gate pattern comprised of polysilicon is formed, a process of forming a metal suicide layer 800 on the surface of the gate pattern 300 is introduced. Alternatively, a process of forming a metal layer instead of the metal silicide layer 800 can be introduced.

More specifically, as has been described in the first embodiment with reference to FIGS. 2–8, the second plug 730' is formed and the recessed groove 15 is formed on the gate pattern 300. Subsequently, silicidation is performed as shown in FIG. 12 to form the metal silicide layer 800 on top of the gate pattern 300. For example, a tungsten silicide layer may be used as the metal silicide layer 800. The silicidation is performed by a general selective silicidation process so that the metal silicide layer 800 may be selectively provided only on the surface of the gate pattern 300 comprised of polysilicon and the second plug 730'. Alternatively, a metal layer such as a tungsten layer instead of the metal silicide layer 800 may exist only on the surface of the gate pattern 300 and the second plug 730'. The metal layer forms a gate of a transistor structure together with the gate pattern 300, so it is advantageously applied to a high speed and highly integrated device.

Thereafter, a process of forming the second contact hole 455 is sequentially performed with reference to FIGS. 9–11 as described above.

According to the present invention, a method of manufacturing a self-aligned contact hole, in which method a very high selectivity between insulating layers is not required, can be provided. Thus, a semiconductor device which requires an extreme reduction in design rules can be stably manufactured.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a self-aligned contact hole in a semiconductor device, the method comprising:

forming a plurality of gate patterns on a semiconductor substrate having an interposing gate insulating layer;

forming a first insulating pattern which fills a gap between adjacent pairs of gate patterns while leaving a top surface of the gate patterns exposed;

selectively etching a portion of the first insulating pattern by self-aligned contact etching to form a first contact hole exposing the semiconductor substrate;

forming a spacer on a sidewall of the first contact hole;

filling the first contact hole with a conductive silicon layer to form a first plug, wherein the first plug is filled to a height equal to the height of the spacer;

performing a partial etchback to selectively etch the first plug and the gate pattern to a predetermined thickness, wherein after the partial etchback, a first horizontal plane defining a top surface of the first plug and the gate pattern is stepped down from a second horizontal plane defined by the height of the spacer, whereby a top portion of the spacer is projected higher than the surface of the first plug and the gate pattern;

forming a second plug layer comprised of a conductive silicon layer on the first plug and the gate pattern, the second plug layer filling at least a gap between the projected spacers, and in which a thickness of the second plug layer at a portion filling the gap between the projected spacers is greater than a thickness of the second plug layer at a portion deposited on the gate pattern;

etching back the second plug layer to a uniform thickness along the entire surface to a point where the second plug layer is equal to the height of the projected spacers, thereby filling the gap between the projected spacers to form a second plug connected to the first plug;

forming a capping protective pattern covering the gate pattern while exposing a top surface of the second plug, the capping protective pattern extending between the first insulating pattern and the spacer; and forming a second insulating pattern on the capping protective pattern, the second insulating pattern having a second contact hole exposing at least the top surface of the second plug.

2. The method of claim 1, wherein the gate pattern is comprised of a conductive polycrystalline silicon.

3. The method of claim 1, wherein forming the first insulating pattern comprises:

forming a first insulating layer along the gate pattern; and planarizing the first insulating layer so that the top surface of the gate pattern is exposed.

4. The method of claim 3, wherein planarizing the first insulating layer is performed by chemical mechanical polishing.

5. The method of claim 1, wherein the first insulating pattern is comprised of silicon oxide and the spacer is comprised of silicon nitride.

6. The method of claim 1, wherein the self-aligned contact etching is performed by introducing a photoresist pattern exposing a portion of the gate pattern onto the gate pattern and the first insulating pattern, and by using the photoresist pattern and the exposed gate pattern as an etch mask.

7. The method of claim 1, wherein the first contact hole exposes at least one side of the gate pattern.

8. The method of claim 1, wherein forming the first plug comprises:

forming a conductive silicon layer for filling the first contact hole on the gate pattern; and planarizing the conductive silicon layer to a point where the top surface of the gate pattern is exposed.

9. The method of claim 8, wherein planarizing the conductive silicon layer is performed by chemical mechanical polishing.

10. The method of claim 1, wherein the partial etchback of the first plug and the gate pattern is performed by anisotropic dry etching.

11. The method of claim 1, wherein, when forming the second plug, the etchback is performed by wet etching.

12. The method of claim 1, wherein, when forming the second plug, the etchback is performed so that at least the top portion of the spacer and the top surface of the first insulating pattern are exposed to expose the sides of the spacer and the first insulating pattern which are adjacent to the gate pattern.

13. The method of claim 12, wherein forming the capping protective pattern comprises:

forming a capping protective layer on the gate pattern to a sufficient thickness to fill at least a gap between exposed sides of the first insulating pattern and the spacer; and planarizing the capping protective layer so as to expose the top surface of the spacer and the second plug.

14. The method of claim 13, wherein the planarization is performed by chemical mechanical polishing.

15. The method of claim 1, wherein the capping protective pattern is comprised of a silicon nitride.

16. The method of claim 1, further comprising selectively forming one of a metal suicide layer and a metal layer on the top surface of the gate pattern, after forming the second plug.

17. The method of claim 16, wherein the metal silicide layer is selectively formed on the top surface of the second plug and the top surface of the gate pattern.

18. The method of claim 1, wherein the second contact hole further exposes at least one of the spacer and the capping protective pattern.

19. The method of claim 1, wherein a diameter of the second contact hole is larger than a diameter of the first contact hole.

* * * * *